United States Patent

Bolduc

(10) Patent No.: US 9,146,281 B2
(45) Date of Patent: *Sep. 29, 2015

(54) ELECTRIC VEHICLE BATTERY CONTACTOR SWITCH MONITORING

(71) Applicant: FORD GLOBAL TECHNOLOGIES, LLC, Dearborn, MI (US)

(72) Inventor: Robert J. Bolduc, Allen Park, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 129 days.

This patent is subject to a terminal disclaimer.

(21) Appl. No.: 14/077,647

(22) Filed: Nov. 12, 2013

(65) Prior Publication Data

US 2015/0130469 A1    May 14, 2015

(51) Int. Cl.
*H02J 7/00*   (2006.01)
*G01R 31/36*   (2006.01)
*G01R 31/04*   (2006.01)

(52) U.S. Cl.
CPC .............. *G01R 31/362* (2013.01); *G01R 31/04* (2013.01)

(58) Field of Classification Search
USPC .................................................. 320/426, 433
See application file for complete search history.

(56) References Cited

U.S. PATENT DOCUMENTS

| | | | |
|---|---|---|---|
| 5,780,980 A * | 7/1998 | Naito | ............................ 318/139 |
| 7,772,799 B2 | 8/2010 | Wu | |
| 7,966,110 B2 | 6/2011 | Tarchinski | |
| 8,513,918 B2 * | 8/2013 | Ueda et al. | .................... 320/116 |
| 2007/0221627 A1 * | 9/2007 | Yugou et al. | .................. 218/136 |
| 2011/0049977 A1 * | 3/2011 | Onnerud et al. | .............. 307/9.1 |
| 2011/0101920 A1 | 5/2011 | Seo et al. | |
| 2013/0069598 A1 | 3/2013 | Tanaka et al. | |

OTHER PUBLICATIONS

Analog Devices, Lithium Ion Battery Monitoring System AD7280A, 2011, pp. 1-48.
Linear Technology, LTC6804-1/LTC6804-2, Multicell Battery Monitors.
Intersil, Multi-cell Li-Ion Battery Manager, Dec. 14, 2012.

* cited by examiner

*Primary Examiner* — Samuel Berhanu
(74) *Attorney, Agent, or Firm* — David B. Kelley; MacMillan, Sobanski & Todd, LLC

(57) ABSTRACT

Contactor switches between a multi-cell battery pack and an electric vehicle load are monitored. A main microcontroller having a chassis ground is digitally isolated from positive and negative busses of the battery pack. A battery monitoring IC having a plurality of auxiliary/thermistor A/D inputs measures respective voltages of battery cells. An evaluation switch is connected to a junction between a first contactor switch and the load. The evaluation switch is activated in response to a command received from the main microprocessor. A voltage divider is coupled between the output of the evaluation switch and the negative bus to provide a divided voltage output to one of the auxiliary/thermistor A/D inputs. The battery monitoring IC transmits a digital value representative of the divided voltage output to the main microprocessor via a serial data link, and the main microprocessor determines a state of the contactor in response to the digital value.

11 Claims, 3 Drawing Sheets

ELECTRIC VEHICLE BATTERY CONTACTOR SWITCH MONITORING

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to vehicles with electric propulsion, and, more specifically, to monitoring of battery contactor switches by a microcontroller that is digitally isolated from the battery circuits.

The DC power source (e.g., a battery) and other elements of electric drives for hybrid or electric vehicles require monitoring in order to maximize efficiency and performance as well as to detect potential malfunctions. Common battery types such as lithium ion (Li-Ion) use a large number of cells stacked together into a battery pack. Besides monitoring the total voltage output by a battery pack, each cell is typically monitored individually to determine their voltage production and other parameters. The temperature of each cell is also monitored in order to protect against overheating.

It is very challenging to reliably monitor the various battery conditions because of the high-voltage levels involved, the range of intermediate voltages at which respective cells operate within the stack, and the high levels of accuracy required. Various battery monitoring integrated circuit devices have been developed commercially for use in the vehicle environment. Examples of a commercially available battery monitoring IC device include the AD7280A device available from Analog Devices, Inc., of Norwood, Mass., the LTC6804 devices available from Linear Technology Corporation of Milpitas, Calif., and the ISL94212 Multi-Cell Li-Ion Battery Manager available from Intersil Corporation of Milpitas, Calif. In addition to a plurality of inputs for directly monitoring respective battery cells, the known IC devices include several analog inputs for measuring the outputs of thermistor circuits used as temperature sensors for the respective battery cells.

The measured parameters of the battery cells, battery pack, and associated devices are all used by a main microcontroller or microprocessor for performing battery management and communication. Some of the primary components to be monitored include the battery contactor switches that couple the battery pack to the vehicle loads (e.g., the inverter for driving an electric motor). The main micro is typically located in a discrete battery control module or box that interfaces with other vehicle components such as a vehicle system/powertrain controller or a driver interface module. Consequently, the main micro uses a chassis ground for its voltage reference. The chassis ground is isolated from the main battery's reference which is provided at a negative battery bus.

The battery monitoring ICs deployed with the battery pack must monitor the battery cells while being referenced to the negative bus. Therefore, the battery monitoring ICs and any other monitoring devices connected in the high-voltage domain must communicate with the main micro through domain-crossing elements that provide digital isolation between the high-voltage battery domain and the chassis ground domain (i.e., low voltage domain) of the main micro.

In order for the main micro to both control the monitoring elements and receive the resulting measured data, relatively expensive components such as photoMOS transistors and a dedicated, high-voltage-referenced analog-to-digital (A/D) converter integrated circuit are typically employed. It would be very desirable to avoid the use of the expensive add-on components while maintaining robust detection of the state of the contactor switches.

SUMMARY OF THE INVENTION

In one aspect of the invention, an electric vehicle system is provided having a multi-cell battery pack supplying a main battery voltage between a positive bus and a negative bus. A first contactor switch selectably couples the positive bus to a load. A second contactor switch selectably couples the negative bus to the load. A main microcontroller monitors performance of the battery pack and contactor switches, the main microcontroller being coupled to a chassis ground and being digitally isolated from the positive and negative busses. A battery monitoring IC is connected to the battery pack to measure respective voltages of cells in the battery pack, wherein the battery monitoring IC has an isolated serial data link to the main microcontroller to report the measured voltages. The battery monitoring IC further includes a plurality of auxiliary/thermistor A/D inputs and an auxiliary output terminal selectably providing a drive signal. An evaluation switch has an input, an output, and a control terminal, wherein the input is connected to a junction between the first contactor switch and the load. The control terminal is coupled to the auxiliary output terminal so that the evaluation switch is activated in response to a command received from the main microprocessor over the serial data link. A voltage divider is coupled between the output of the evaluation switch and the negative bus providing a divided voltage output to one of the auxiliary/thermistor A/D inputs. The battery monitoring IC transmits a digital value representative of the divided voltage output to the main microprocessor via the serial data link, and the main microprocessor determines a state of the first contactor in response to the digital value.

DETAILED DESCRIPTION OF PREFERRED EMBODIMENTS

Figure 1:
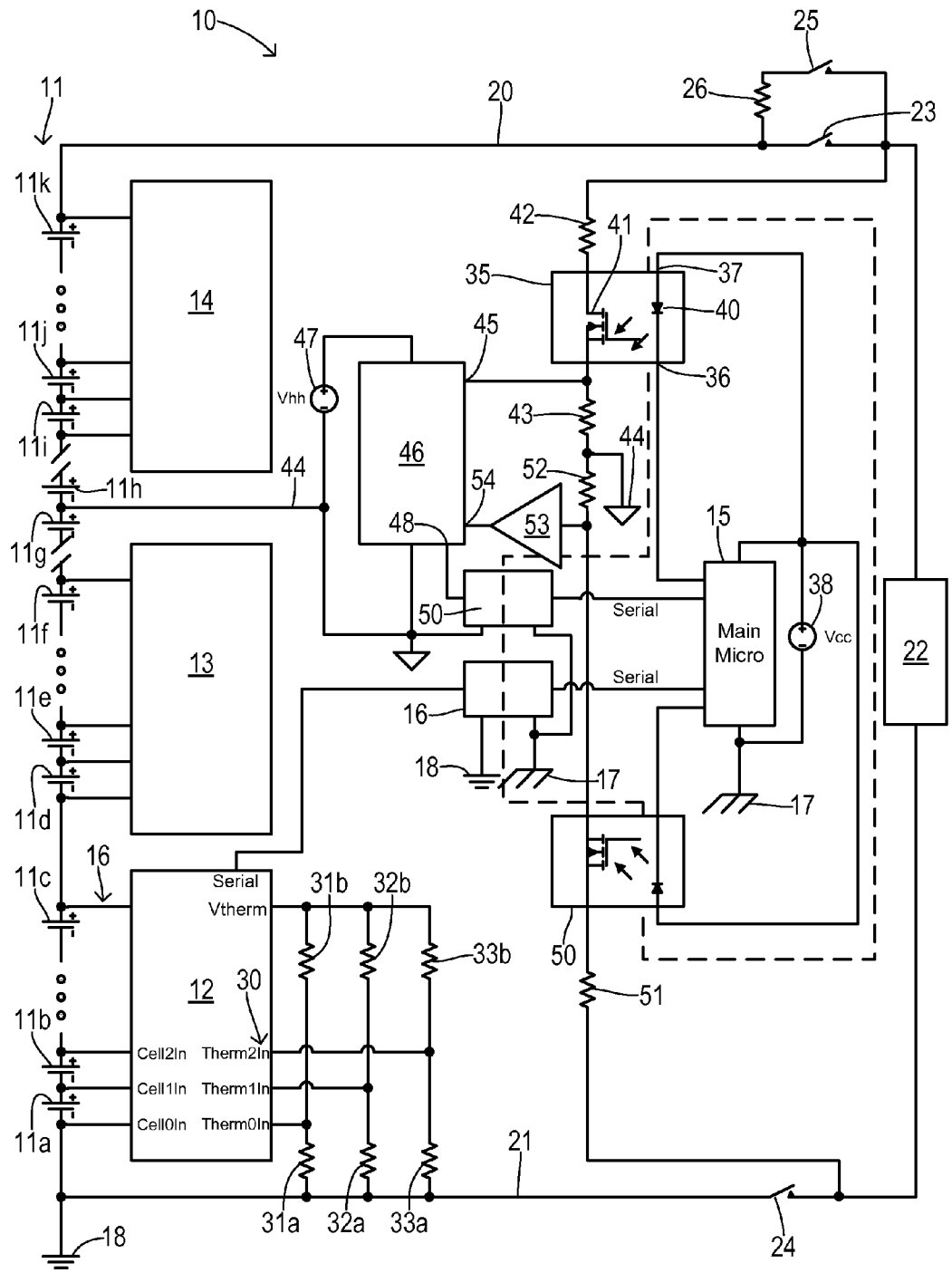
FIG. 1 is a schematic, block diagram showing one embodiment of a prior art electric drive system.

Referring now to FIG. 1, a conventional electric vehicle system 10 includes a main battery pack 11 having individual cells including a plurality of representative cells 11a-11k. A plurality of battery monitoring ICs 12, 13, and 14 are connected to respective ones of the battery cells in a stacked manner. Cell monitoring inputs 16 connect each corresponding cell to a respective input pin (e.g., CellOIn) of battery monitoring ICs 12-14. The same interconnections shown for battery monitoring IC 12 would also be present for battery monitoring ICs 13 and 14, but are not all shown in FIG. 1. A main micro processor 15 receives measured data from a serial output of IC 12 coupled through a digital isolator 16, thereby forming a serial data link capable of two-way communication between the high-voltage domain of IC 12 and the low voltage, chassis grounded domain of main micro 15. Main micro 15 is coupled to a chassis ground 17 while isolation circuit 16 is coupled to both the chassis ground 17 and a high-voltage ground 18.

The output of battery pack 11 is coupled between a positive bus 20 and a negative bus 21. Vehicle loads 22 such as a DC-to-AC inverter for driving an electric motor machine (which may be preceded by a DC-to-DC boost converter) receives DC power from busses 20 and 21 via main contactor switches 23 and 24, respectively. A precharge switch 25 and precharge resistor 26 may be coupled across positive contactor switch 23 as known in the art. Contactor switches are driven in a conventional manner as known in the art.

Battery monitoring IC 12 includes a plurality of auxiliary/thermistor A/D inputs 30 each coupled to negative bus 21 and ground 18 via respective thermistors 31a-33a. Each thermistor is coupled to a reference voltage by respective pull-up resistors 31b-33b. Thermistors 31a-33a are each mounted in proximity to a respective battery cell to act as temperature probes. Each respective thermistor voltage is converted by battery monitoring IC 12 to a corresponding digital value which is sent to main micro 15 along with the individual cell voltages over the serial data link to allow main micro 15 to monitor operation of each battery cell.

It is desired for main micro 15 to also monitor the state of contactor switches 23 and 24 to ensure they properly respond to their respective control signals (not shown). Thus, it is desired to measure the voltages at the load sides of switches 23 and 24, which requires measurement in the high-voltage domain.

In the conventional systems, dedicated circuitry has been required for inferring the state of contactor switches 23 and 24 based on measured voltages at the junctions between the contactor switches and the load. For example, a first domain-crossing device 35 may be comprised of a photoMOS device with a control input 36 coupled to receive a logic-level control signal from main micro 15. A reference input 37 receives a reference voltage $v_{cc}$ from a supply 38. Main micro 15 pulls down input 36 to a low logic level in order to activate a photodiode light source 40 in device 35 thereby turning on an output transistor 41.

A resistor 42 couples a drain of transistor 41 to the load side of contactor switch 23. A source of transistor 41 is connected to one side of a resistor 43 having its other side coupled to a midpoint voltage reference 44 at a midpoint of battery pack 11. The source of transistor 41 is further connected to a conversion input 45 of a dedicated analog-to-digital converter (ADC) 46. A high-voltage-domain auxiliary source 47 provides a supply voltage $v_{hh}$ for ADC 46. When main micro 15 initiates an evaluation of the state of contactor switch 23, it activates domain crossing device 35, thereby turning on transistor 41 and forming a voltage divider comprised of resistors 42 and 43 between the load side of contact switch 23 and reference voltage 44. The voltage at the junction of resistors 42 and 43 is sampled by ADC 46 and the resulting digital value is output by a serial output 48 to an isolation circuit 50 for transmission back to a corresponding serial input of main micro 15.

In order to determine the state of negative contactor switch 24, a domain crossing device 50 similarly connected to main micro 15 activates a voltage divider comprised of resistors 51 and 52 between midpoint reference voltage 44 and the load side of switch 24. A voltage appearing between resistors 51 and 52 is inverted by an inverting amplifier 53 and coupled to a converting input 54 on ADC 46, and the resulting digital value is coupled from output 48 back to main micro 15. In each case, main micro 15 evaluates the digital values obtained from the voltage dividers to determine whether battery voltage is seen or not seen as expected according to the state of contactor switches 23 and 24.

Figure 2:
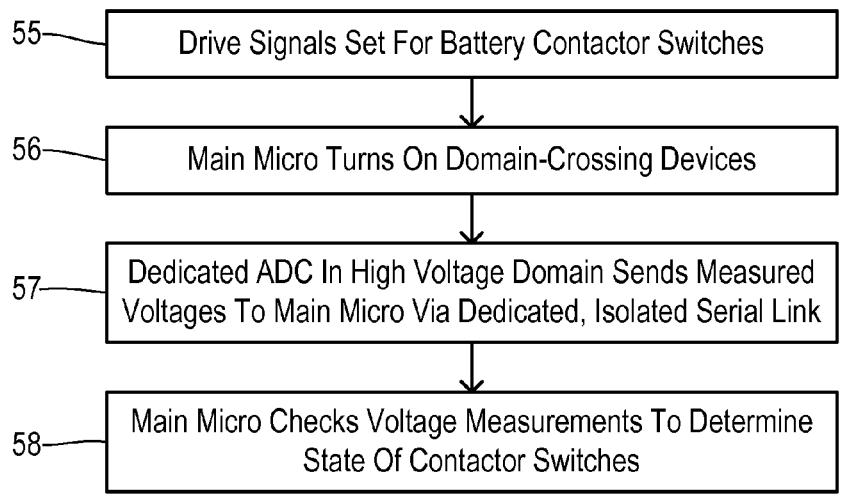
FIG. 2 is a flowchart showing a method used in the system of FIG. 1.

FIG. 2 summarizes the prior art method for determining the state of the contactor switches. In step 55, appropriate drive signals are set for the battery contactor switches according to whether the loads should be connected to battery or not. When the main micro is attempting to verify that the desired position of the contactor switches has been obtained, it turns on the domain crossing devices in step 56. The dedicated analog-to-digital converter in the high-voltage domain sends the measured voltages from the respective voltage dividers to the main micro via a dedicated, isolated serial link in step 57. In step 58, the main micro checks the voltage measurements to determine the state of the contactor switches. For example, a positive voltage greater than a predetermined threshold would be expected when a contactor switch is closed. If the required voltage is not found during a time when a contactor switch has been commanded to be closed, then a failure of the contactor switch is inferred.

The domain crossing switches and dedicated components (e.g., including an analog to digital convertor, digital isolation, and inverting amplifier) result in significant added expense. It would be desirable to better utilize the capabilities of battery monitoring ICs to evaluate the contactor states without the addition of high cost components.

Figure 3:
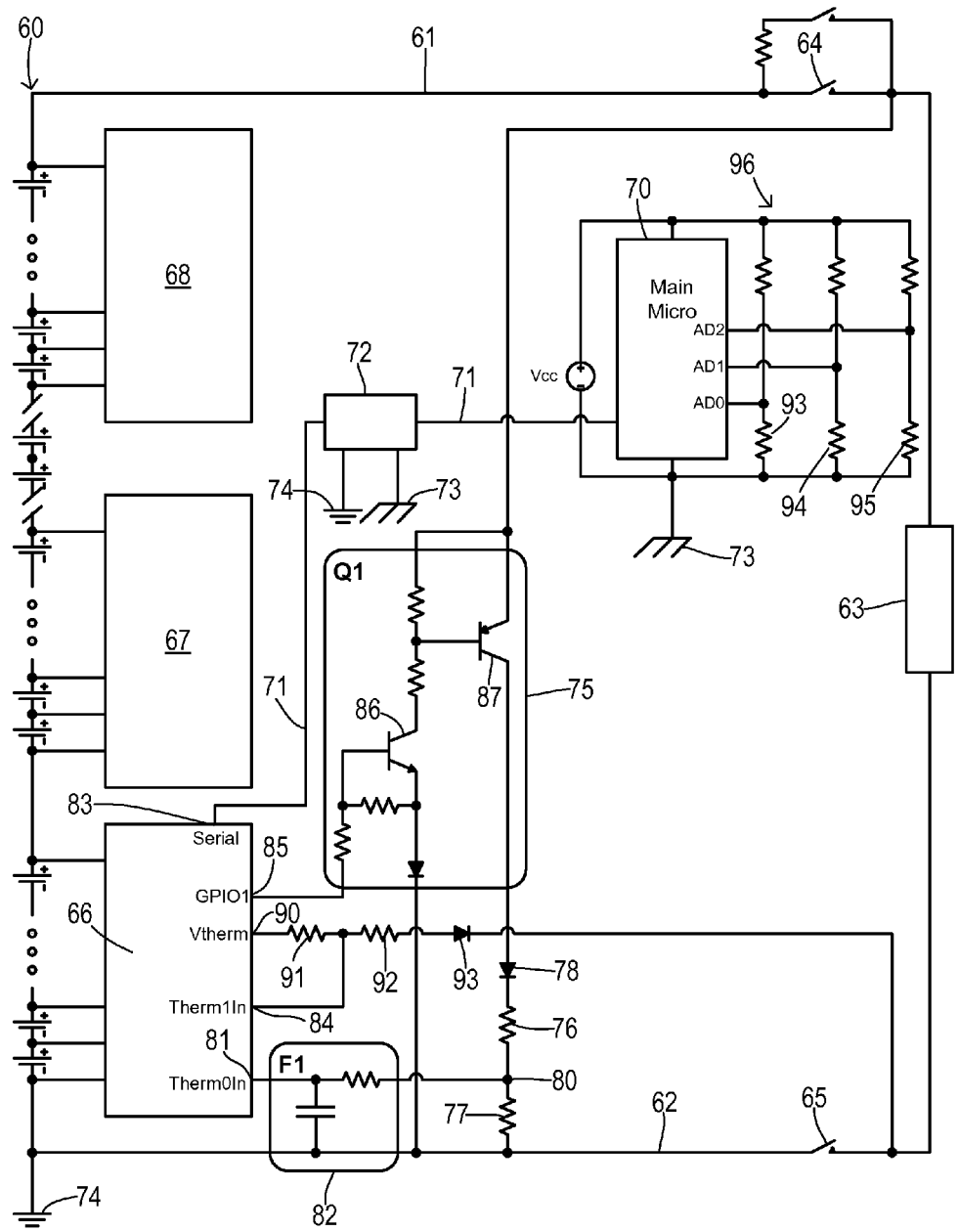
FIG. 3 is a schematic, block diagram of one embodiment of an electric drive system of the present invention with a lower cost implementation of contactor switch monitoring.

As shown in FIG. 3, the present invention achieves the foregoing goals by repurposing of the auxiliary/thermistor A/D inputs of a battery monitoring IC from performing temperature monitoring to performing contactor state determination.

A multi-cell battery pack 60 provides a main battery voltage between positive bus 61 and negative bus 62. The electric vehicle loads 63 (e.g., boost converter and inverter) are coupled to buses 61 and 62 by a positive contactor switch 64 and by a negative contactor switch 65. A plurality of battery monitoring ICs 66-68 are connected in the same manner to individual battery cells for monitoring cell voltages and the like. Each battery monitoring IC has a serial data link with a main micro 70, such as a serial link 71 provided from serial output pin 83 of battery monitoring IC 66 to main micro 70 through a digital isolation circuit 72. As known in the art, sending a serial link (e.g., SPI=Small Peripheral Interface) across the high voltage, low voltage domain barrier can be done using a digital isolator (e. g., Analog Devices ADuM1401 quad-channel digital isolator). Main micro 70 is referenced to a chassis ground 73, while the high-voltage domain is referenced to a high-voltage ground 74. Main micro 70 is digitally isolated from buses 61 and 62 so that it can be easily connected to other control modules (not shown) throughout the vehicle.

In order to determine the state of positive contactor switch 64, a high-voltage evaluation switch 75 has an input coupled to the junction between positive contactor switch 64 and load 63, and an output coupled to negative bus 62 through a voltage divider comprised of resistors 76 and 77. A reverse voltage blocking diode 78 may be coupled between the output of switch 75 and resistor 76 to handle switching and other transients. A junction 80 between high side and low side resistors 76 and 77 provides a divided voltage output to an auxiliary/thermistor A/D input 81 of IC 66 through a filter 82 that may be optionally included for further reducing noise and transients.

Evaluation switch 75 may include appropriately biased switching transistors 86 and 87 for toggling the output in response to a selectable drive signal received from an auxiliary output terminal 85 of IC 66. Terminal 85 may be a general purpose input/output pin as commonly used in the art. Many other acceptable transistor devices and drive configurations could be used for switch 75.

When a determination of the state of positive contactor switch 64 is needed by main micro 70, it sends a corresponding command to battery monitoring IC 66 via serial link 71. In response, auxiliary output terminal 85 is driven high in order to turn on evaluation switch 75. If the state of contactor switch 64 is closed, then the main battery voltage between buses 61 and 62 is coupled across diode 78 and resistor 76 and 77. A positive voltage results at output 80 which is coupled to an auxiliary A/D input 81 so that a corresponding digital value is transmitted to main micro 70 over serial data link 71. The digital value representative of the divided voltage output is compared by main micro 70 to an appropriate threshold value in order to determine whether contactor switch 64 is closed as expected. If contactor switch 64 failed to close, then load 63 would still be unpowered and divided voltage output 80 would have a voltage corresponding to negative bus 62. Thus, the state of contactor switch 64 is determined in the high voltage domain using only relatively inexpensive components.

In order to determine the state of negative contactor switch 65, a positive voltage supply terminal 90 of IC 66 is coupled to the junction between contactor switch 65 and load 63 by a voltage divider comprised of resistors 91 and 92 in series with a reverse voltage blocking diode 93. The junction between voltage divider resistors 91 and 92 is coupled to a second auxiliary/thermistor A/D input pin 84 of IC 66. When contactor switch 65 is open, then no current flows through second voltage divider 91/92 and the voltage at input 84 is substantially equal to the positive voltage from supply terminal 90. When contactor switch 65 is closed, a current flowing through resistors 91 and 92 produces a second divided voltage at input 84 which is lower than the positive voltage supply. The second digital value representative of the second divided voltage is transmitted by IC 66 to main micro 70 over serial data link 71 to be compared by main micro 70 against a second threshold to thereby determine whether contactor switch 65 is closed.

By utilizing the thermistor A/D inputs of the battery monitoring IC to instead perform contactor switch state evaluation, the inputs are no longer available for performing temperature monitoring of at least some of the battery cells. However, thermistors used for the purpose of temperature monitoring do not need to be connected in the high voltage domain. Thus, the present invention can continue to monitor the temperature of cells connected to battery monitoring IC 66 by connecting the corresponding thermistors 93-95 to available A/D inputs of main micro 70. Resistors 96 are the pull up resistors for thermistors 93-95. Since only the auxiliary A/D inputs of battery monitoring IC 66 have been repurposed, corresponding thermistors for the cells being monitored by ICs 67 and 68 may continue to be connected to ICs 67 and 68, with the corresponding data being provided to main micro 70 over corresponding serial data links.

Figure 4:
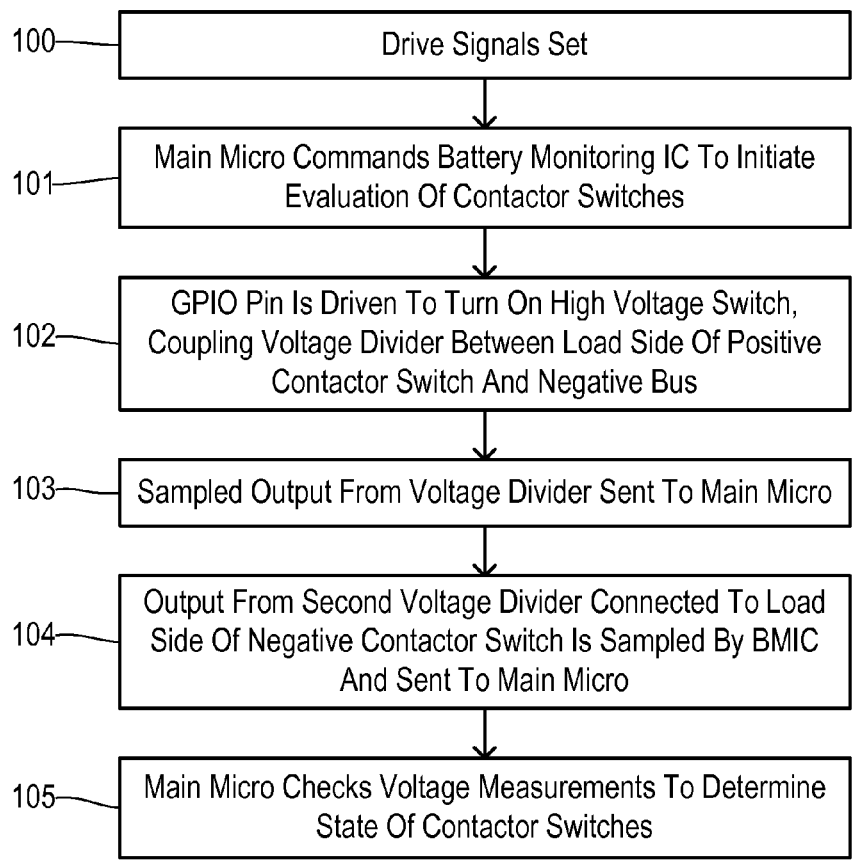
FIG. 4 is a flowchart of one preferred method of the invention.

A preferred method of the invention is shown by the flowchart in FIG. 4. Drive signals to the contactor switches are set in step 100. At appropriate times during its operation, the main micro commands a battery monitoring IC to initiate evaluation of the contactor switches in step 101. In step 102, a general purpose input/output pin is switched to a high voltage to turn on the high voltage switch, thereby coupling the corresponding voltage divider between the load side of the positive contactor switch and the negative bus. A divided output voltage from the voltage divider is sampled in step 103 and sent to the main micro using the serial data link. In step 104, the output of a second voltage divider connected to the load side of the negative contactor switch is sampled by the battery monitoring IC and sent to the main micro. Then the main micro checks the voltage measurements in step 105 to determine the state of the contactor switches. Thus, the states of the contactor switches can be determined without the need for photoMOS devices or other dedicated, high cost components in the high voltage domain. Instead, the preexisting battery monitoring IC can be controlled via a serial link with the main micro which already has a mechanism for traversing between the two voltage domains.

What is claimed is:

1. An electric vehicle system, comprising:
a multi-cell battery pack providing a main battery voltage between a positive bus and a negative bus;
a first contactor switch selectably coupling the positive bus to a load;
a main microcontroller monitoring performance of the battery pack and contactor switches, the main microcontroller being coupled to a chassis ground and being digitally isolated from the positive and negative busses;
a battery monitoring IC connected to the battery pack to measure respective voltages of cells in the battery pack, wherein the battery monitoring IC has an isolated serial data link to the main microcontroller to report the measured voltages, and wherein the battery monitoring IC further includes a plurality of auxiliary A/D inputs and an auxiliary output terminal selectably providing a drive signal;
an evaluation switch having an input, an output, and a control terminal, wherein the input is connected to a junction between the first contactor switch and the load, and wherein the control terminal is coupled to the auxiliary output terminal so that the evaluation switch is activated in response to a command received from the main microcontroller over the serial data link; and
a voltage divider coupled between the output of the evaluation switch and the negative bus and providing a divided voltage output to one of the auxiliary A/D inputs;
wherein the battery monitoring IC transmits a digital value representative of the divided voltage output to the main microcontroller via the serial data link, and wherein the main microcontroller determines a state of the first contactor in response to the digital value.

2. The system of claim 1 wherein the voltage divider is comprised of a high side resistor coupled in series with a low side resistor, wherein a junction between the resistors provides the divided voltage output, and wherein the system further comprises a reverse voltage blocking diode coupled between the evaluation switch and the high side resistor.

3. The system of claim 2 further comprising a filter coupled between the auxiliary A/D input and the junction between the high side and low side resistors.

4. The system of claim 1 wherein the battery monitoring IC has a positive voltage supply terminal, and wherein the system further comprises:
a second contactor switch selectably coupling the negative bus to the load;
a second voltage divider coupled from the positive voltage supply terminal to a junction between the second contactor switch and the load, wherein the second voltage divider provides a second divided voltage to a second one of the auxiliary A/D inputs;

wherein the battery monitoring IC transmits a second digital value representative of the second divided voltage to the main microcontroller via the serial data link, and wherein the main microcontroller determines a state of the second contactor in response to the second digital value.

5. The system of claim 4 further comprising a reverse voltage blocking diode coupling the second voltage divider to the junction between the second contactor switch and the load.

6. The system of claim 1 further comprising a thermistor mounted for sensing a temperature of the battery pack and coupled to an A/D conversion input of the main microcontroller and to the chassis ground.

7. A method of monitoring a battery pack and contactor switches in an electric drive of an electric vehicle, comprising:
digitally isolating a main microprocessor which is coupled to a chassis ground from a battery monitoring IC which is connected to the battery pack to measure respective voltages of cells in the battery pack, wherein the battery monitoring IC has an isolated serial data link to the main microprocessor to report the measured voltages;
selectably coupling a voltage divider between a load side of a positive contactor switch and a battery side of a negative bus which is coupled to the battery pack;
digitally sampling a divided voltage using an auxiliary input of the battery monitoring IC;
transmitting a digital sample to the main microprocessor via the isolated serial data link; and
evaluating the digital sample to determine an open or closed state of the positive contactor switch.

8. The method of claim 7 further comprising:
selectably coupling a second voltage divider between a voltage supply terminal of the IC and a load side of a negative contactor switch;
digitally sampling a second divided voltage using a second auxiliary input of the IC;
transmitting a second digital sample to the main microprocessor via the isolated serial data link;
evaluating the second digital sample to determine an open or closed state of the negative contactor switch.

9. An electric vehicle system, comprising:
a multi-cell battery pack providing a main battery voltage between a positive bus and a negative bus;
a first contactor switch selectably coupling the positive bus to a load;
a main microcontroller monitoring performance of the battery pack and contactor switches, the main microcontroller being coupled to a chassis ground and being digitally isolated from the positive and negative busses;
a battery monitoring IC connected to the battery pack to measure respective voltages of cells in the battery pack, wherein the battery monitoring IC has an isolated serial data link to the main microcontroller to report the measured voltages, and wherein the battery monitoring IC further includes a plurality of auxiliary A/D inputs and an auxiliary output terminal selectably providing a drive signal;
an evaluation switch having an input, an output, and a control terminal, wherein the input is connected to a junction between the first contactor switch and the load, and wherein the control terminal is coupled to the auxiliary output terminal so that the evaluation switch is activated in response to a command received from the main microcontroller over the serial data link; and
a voltage divider coupled between the output of the evaluation switch and the negative bus and providing a divided voltage output to one of the auxiliary A/D inputs;
wherein the battery monitoring IC transmits a digital value representative of a voltage at the junction between the first contactor switch and the load.

10. The system of claim 9 wherein the voltage divider is comprised of a high side resistor coupled in series with a low side resistor, wherein a junction between the resistors provides the divided voltage output, and wherein the system further comprises a reverse voltage blocking diode coupled between the evaluation switch and the high side resistor.

11. The system of claim 10 further comprising a filter coupled between the auxiliary A/D input and the junction between the high side and low side resistors.

* * * * *